(12) United States Patent
Tzeng et al.

(10) Patent No.: US 10,950,483 B2
(45) Date of Patent: Mar. 16, 2021

(54) SYSTEMS AND METHODS FOR FIXED FOCUS RING PROCESSING

(71) Applicant: Taiwan Semiconductor Manufacturing Co., Ltd., Hsin-Chu (TW)

(72) Inventors: Huan-Lisng Tzeng, Hsinchu (TW); Chen-Chun Yan, Zhubei (TW); Yao-Pin Yang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/195,699

(22) Filed: Nov. 19, 2018

(65) Prior Publication Data

US 2019/0164804 A1 May 30, 2019

Related U.S. Application Data

(60) Provisional application No. 62/591,431, filed on Nov. 28, 2017.

(51) Int. Cl.
| | |
|---|---|
| *H01L 21/3065* | (2006.01) |
| *H01L 21/687* | (2006.01) |
| *H01L 21/67* | (2006.01) |
| *H01L 21/677* | (2006.01) |
| *C23C 16/455* | (2006.01) |
| *H01L 21/683* | (2006.01) |
| *H01J 37/00* | (2006.01) |

(52) U.S. Cl.
CPC .. *H01L 21/68721* (2013.01); *C23C 16/45591* (2013.01); *H01J 37/00* (2013.01); *H01L 21/67069* (2013.01); *H01L 21/67712* (2013.01); *H01L 21/67718* (2013.01); *H01L 21/67748* (2013.01); *H01L 21/6831* (2013.01); *H01L 21/68707* (2013.01); *H01L 21/68735* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 5,891,348 A * | 4/1999 | Ye | H01J 37/3244 216/67 |
| 2002/0154975 A1* | 10/2002 | Perlov | H01L 21/67748 414/416.03 |
| 2011/0256812 A1 | 10/2011 | Dhandapani et al. | |
| 2012/0160808 A1* | 6/2012 | Kikuchi | H01L 21/6831 216/67 |
| 2012/0247954 A1* | 10/2012 | Yamawaku | H01J 37/32715 204/298.31 |

(Continued)

*Primary Examiner* — Ali Naraghi
(74) *Attorney, Agent, or Firm* — Duane Morris LLP

(57) ABSTRACT

In an embodiment, a system includes: a base with a bore hole, wherein the base is configured to secure a wafer at a first position on the base; a pin extending through the bore hole; a focus ring horizontally surrounding the wafer at the first position and extending upwardly from the base, wherein the wafer is configured to be moved vertically between the first position and a second position above the focus ring via the pin; and a slit valve above the focus ring, wherein the wafer is configured to be moved horizontally between the second position and the slit valve via a robotic arm.

20 Claims, 5 Drawing Sheets

(56) References Cited

U.S. PATENT DOCUMENTS

| | | | |
|---|---|---|---|
| 2013/0186858 A1* | 7/2013 | Suzuki | H01J 37/32477 216/67 |
| 2015/0132967 A1* | 5/2015 | Urakawa | H01J 37/32091 438/714 |
| 2015/0340209 A1* | 11/2015 | Koltonski | H01J 37/32642 156/345.31 |
| 2018/0171473 A1* | 6/2018 | Agarwal | C23C 16/4581 |
| 2018/0182647 A1* | 6/2018 | Noh | C23C 16/4585 |

* cited by examiner

SYSTEMS AND METHODS FOR FIXED FOCUS RING PROCESSING

CROSS-REFERENCE TO RELATED APPLICATIONS

This application claims priority to U.S. Application No. 62/591,431, filed Nov. 28, 2017. The content of the above application is incorporated by reference in its entirety.

BACKGROUND

Semiconductor wafer processing operations such as etching or chemical vapor deposition are often carried out in a semiconductor wafer processing chamber using a plasma reactor and a focus ring around the wafer. The focus ring may focus plasma or gas on the wafer and reduce the non-uniformity of the wafer etch rate which is caused by non-uniform plasma or gas distribution across the wafer. Normally, the non-uniform plasma or gas distribution is caused by the non-uniform gas flow distribution across the wafer and other factors such as non-uniform temperature, electrical field, and magnetic field distribution across the wafer. A vacuum pump in the bottom of the chamber continuously draws gases out of the chamber in order to maintain a particular vacuum level in the chamber.

Typically, the wafer periphery may be shielded by the focus ring surrounding the wafer periphery. The focus ring may extend above the wafer periphery by a few centimeters, typically, and the focus ring may be supported by a lift mechanism which may move the focus ring up enough to allow the wafer to be transferred, via a robotic arm, from under the focus ring and above a base. Techniques for using the lift mechanism to move the focus ring requires large amounts of overhead and expensive hardware, but still fail to produce satisfactory results.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
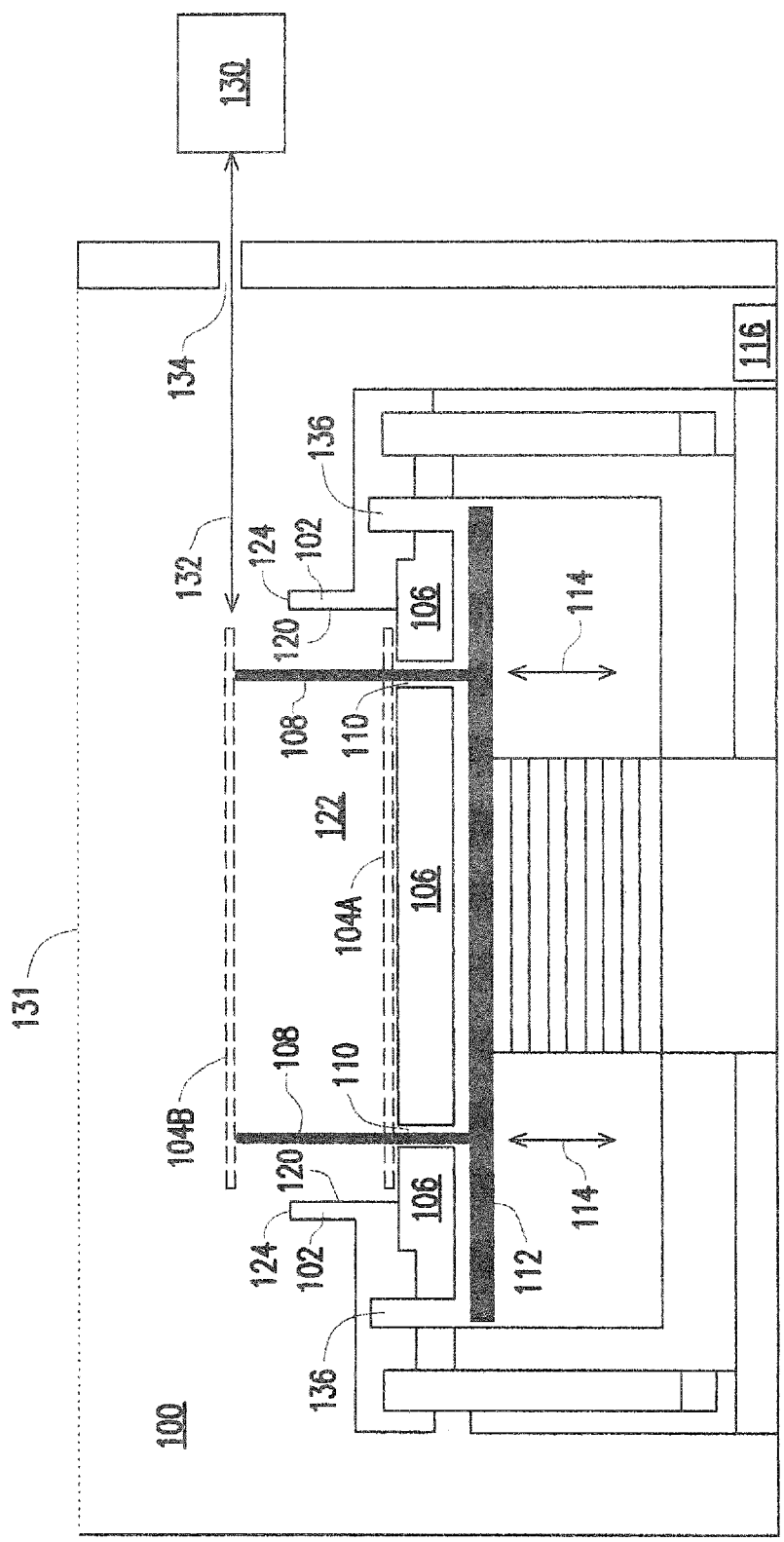
FIG. 1 is a cross sectional diagram of a semiconductor wafer processing chamber, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of fixed focus ring semiconductor wafer processing. As introduced above, a traditional focus ring is moved in order to orient a wafer within the bounds of the traditional focus ring. The traditional focus ring is moved up (e.g., vertically displaced) to reveal a clearance under the traditional focus ring. A wafer is horizontally moved through this clearance and into the bounds of the traditional focus ring. Then, the traditional focus ring is moved back down to surround the extremities of the wafer in preparation for semiconductor wafer processing.

However, in accordance with various embodiments, fixed focus ring semiconductor wafer processing may process a wafer in a semiconductor wafer processing chamber with a fixed, or immobile, focus ring. Specifically, a wafer may be brought over an inner annulus region of a focus ring. Then the wafer may be lowered into the inner annulus region of the focus ring in preparation for semiconductor wafer processing. Accordingly, the focus ring need not be moved in order to dispose the wafer in the inner ring for semiconductor wafer processing.

In various embodiments, a fixed focus ring is part of a semiconductor wafer processing chamber that processes a wafer within the inner annulus region of the focus ring. In order to access the chamber, a slit valve along the wall of the chamber may provide a structure for ingress and egress of a robotic arm that moves a wafer horizontally into and out of the chamber. The slit valve may be disposed along the chamber wall at a location that is above the focus ring, so that the robotic arm may horizontally move between the slit valve and a position above the focus ring and above the inner annulus region of the fixed focus ring. Then, the wafer may be moved vertically between the wafer's position as secured by the robotic arm to rest on a base within the inner annulus region. The collection of all of the various parts of a semiconductor wafer processing chamber with a fixed focus ring (e.g., the base, fixed focus ring, pins, robotic arm, base, slit valve, fixed focus ring system functional module, and the like) may be referred to as a fixed focus ring system.

As noted above, a wafer may be processed in the semiconductor wafer processing chamber. Example processes that may be performed in these semiconductor wafer processing chambers include processes related to physical vapor deposition (PVD), chemical vapor deposition (CVD), wet etching, dry etching, wet cleaning, dry cleaning, and plasma etching. For reference, a few of the example processes will be discussed below to demonstrate the context in which a fixed focus ring can be used.

PVD is a process for depositing a thin film of material on a wafer. PVD can be used in the fabrication of semiconductor devices. The PVD process is carried out at high vacuum in a chamber containing a wafer and a solid source or slab of the material to be deposited on the wafer. In the PVD process, the PVD target is physically converted from a solid into a vapor. The vapor of the target material is transported from the PVD target to the wafer where it is condensed on the wafer as a thin film. There are many methods for accomplishing PVD including evaporation, e-beam evaporation, plasma spray deposition, and sputtering. Using sputtering as an example, a gas plasma is created in the chamber and directed to the PVD target. The plasma physically dislodges or erodes (e.g., sputters) atoms or molecules from the reaction surface of the PVD target into a vapor of the target material, as a result of collision with high-energy particles (ions) of the plasma. The vapor of sputtered atoms or molecules of the target material is transported to the wafer through a region of reduced pressure and condenses on the wafer, forming the thin film of the target material. Accordingly, the fixed focus ring can focus the sputtered atoms or molecules of the target material to a wafer disposed within the fixed focus ring. By being immobile, the fixed focus ring will be less susceptible to damage (e.g., exposure) from the sputtered atoms or molecules of the target than if the fixed focus ring was mobile. For example, the sputtered atoms or molecules will not get in-between moving parts as there are no moving parts of an immobile, fixed focus ring.

CVD is the process of depositing a solid material from a gaseous phase onto a wafer by a chemical reaction. The deposition reaction involved is generally thermal decomposition, chemical oxidation, or chemical reduction. In one example of thermal decomposition, organometallic compounds are transported to the wafer surface as a vapor and are reduced to the elemental metal state on the wafer surface. The CVD process can be used to deposit many materials (e.g., elements and alloys as well as compounds including oxides, nitrides and carbides). Accordingly, the fixed focus ring can focus the chemical reaction of CVD to a wafer disposed within the fixed focus ring. By being immobile, the fixed focus ring will be less susceptible to damage (e.g., exposure) from the deposited materials than if the fixed focus ring was mobile. For example, the deposited materials will not get in-between moving parts as there are no moving parts of an immobile, fixed focus ring.

Etching is the process of removing regions of the underlying material that are no longer protected by a photoresist after development. The etching process is said to be isotropic (e.g., wet etching) if it proceeds in all directions at the same rate. If it proceeds in only one direction, then it is anisotropic (e.g., dry etching). Stated another way, etching refers to a process of removing predetermined portions of material by wet etching (e.g., removal of material via application of a chemical) or by dry etching (e.g., removal of material via plasma). As opposed to dry etching, wet etching can be isotropic, thereby being suitable for use in three-dimensional devices (e.g., metal wiring or contact holes in a semiconductor device). For example, portions of an oxide layer can be etched to form and/or to expose active regions (e.g., source/drain regions, gate regions, and so forth) on a wafer. Accordingly, the fixed focus ring can focus the chemical or plasma used in either wet or dry etching to a wafer disposed within the fixed focus ring. By being immobile, the fixed focus ring will be less susceptible to damage (e.g., exposure) from the chemical or plasma than if the fixed focus ring was mobile. For example, the chemical or plasma will not get in-between moving parts as there are no moving parts of an immobile, fixed focus ring.

FIG. 1 is a cross sectional diagram of a semiconductor wafer processing chamber 100, in accordance with some embodiments. The semiconductor wafer processing chamber 100 includes a fixed focus ring 102 surrounding a wafer 104A around the extremities of the wafer 104A. The wafer 104A may rest on a base 106. The wafer 104A may be moved from a lower position (illustrated as the wafer 104A in the lower position) to an upper position (illustrated as the wafer in the upper position 104B) via pins 108 that extend through bore holes 110 in the base 106. Stated another way, the pins 108 may be part of a lift mechanism 112 that may move vertically (e.g., up and down, or in a z direction 114) in order to move the wafer between the upper and lower positions. The base 106 may, in part, include an electrostatic chuck configured to secure the wafer 104A while it rests on the base 106 during semiconductor wafer processing.

As will be discussed further below, the region enveloped by the fixed focus ring 102 between the internal walls 120 of the fixed focus ring 102 may be termed as the inner annulus region 122 of the fixed focus ring 102. In certain embodiments, the fixed focus ring 102 is fixed (e.g., immovably secured) to the base 106. Notably, the inner annulus region may be bounded horizontally (e.g., between the internal walls) but not vertically (e.g., such that the wafer in the upper position 104B is within the inner annulus region). The internal walls 120 of the fixed focus ring may direct gas or plasma, for example, from a gas intake orifice above the fixed focus ring to focus between the internal walls 120 so as to process the wafer supported by the base 106 within the chamber 100. Also, the wafer may be moved vertically to cross the entirety of the inner annulus from top to bottom before and after semiconductor wafer processing using the pins 108. Accordingly, the pins 108 may extend from the base surface in the inner annulus region to beyond the top 124 (e.g., the most vertical point at the end of the fixed focus ring height) of the internal walls 120. For example, in certain embodiments, the pins are configured to move from the base surface in the inner annulus region to clear the top 124 of the internal wall 120 by about 1% to 300% of the total height of the internal walls 120. In particular embodiments, the pins are configured to move from the base surface in the inner annulus region to clear the top 124 of the internal wall 120 by about 25% to 100% of the total height of the internal walls 120 to provide sufficient but not excessive clearance for the robotic arm 130 (discussed further below) above the top 124 of the internal wall 120. Additionally, the height of the internal walls 120 can be the same or different and adjusted according to experimental results depicting the actual flow or density distribution of the plasma or gas, enabling uniformity of the flow or density distribution of the plasma or gas on the entire wafer, further enhancing uniformity of etching on the wafer.

In addition to being moved vertically using the pins 108, the wafer may be moved horizontally via a robotic arm 130. The robotic arm 130 may be configured to move the wafer horizontally 132 (e.g., along an axis orthogonal to the Z axis, such as along an X and/or Y axis). The robotic arm 130 may be configured to move the wafer horizontally thorough a slit valve 134.

Although illustrated as being open, in certain embodiments the slit valve 134 may be closed except when a robotic aim and/or a wafer is to pass through the slit valve 134. Furthermore, the slit valve may be disposed above the top 124 (e.g., the most vertical point) of the internal walls 120 of the fixed focus ring 102. In certain embodiments, the robotic arm 130 may include a wafer transfer blade or clamp that may secure the wafer during transport by the robotic arm 130.

In certain embodiments, a semiconductor wafer processing chamber 100 may include a retrofitted fixed focus ring by removing and/or disusing implements that may otherwise be utilized to move a focus ring. For example, a semiconductor wafer processing chamber may include a focus ring bore hole 136 through the base 106 where focus ring pins used to move a focus ring would have been. However, as the fixed focus ring is not moved, the focus ring pins in the focus ring bore hole 136 may not be present and/or may not be utilized in conjunction with a fixed focus ring.

In particular embodiments, the semiconductor wafer processing chamber 100 may be entirely enclosed to provide a controlled environment during semiconductor wafer processing. For example, a ceiling 131 may enclose the semiconductor wafer processing chamber 100 but also have a gas intake orifice to provide controlled entry of a gas, plasma, etchant, or other processing medium, into the chamber. Also, a vacuum pump 116 may draw the gas, plasma, etchant, or other processing medium out of the chamber 100 in a controlled way during semiconductor wafer processing. Furthermore, the slit valve 134 may be controlled to open and/or close based upon whether a wafer is being processed within the chamber 100. For example, the slit valve 134 may be closed when a wafer is being processed in the chamber and may be open when a wafer is not being processed (e.g., when a wafer is being transported to or from the chamber).

In operation, the wafer 104A can be moved horizontally through the slit valve 134 above the fixed focus ring 102. Accordingly, the wafer 102A can be moved to an upper position (e.g., illustrated as wafer 104B) above the fixed focus ring 102 within the inner annulus region of the fixed focus ring 102. The wafer in the upper position 104B can be moved by the robotic arm 130 that is configured to move the wafer horizontally. In particular embodiments, the robotic arm 130 is not configured to move the wafer vertically.

Then, the wafer in the upper positon 104B can be received at the pin 108 above the focus ring 102. The pin 108 can extend from the base 106 to the location of the wafer 104B held by the robotic arm 130 above the fixed focus ring 102. The pin 108 can extend from a location within the base 106, such that the pins 108 do not extend out of the bore holes 110 when not extended to interact with the wafer 104B. The robotic arm 130 can release the wafer 104B and retract back through the slit valve 134. During and/or after the retraction of the robotic arm 130, control of the wafer 104B can pass from the robotic arm 130 to the pin 108. The pin 108 can support the wafer 104B by having the wafer 104B rest on the pin 108 after release by the robotic arm 130. In various embodiments, multiple pins 108 can be utilized to provide even support for the wafer 104B on the pin 108. In particular embodiments, the multiple pins 108 can be arranged adjacent an extremity of the wafer 104B within the circumference of the wafer 104B.

The pin 108 can be retracted through the annulus ring region so that the wafer 104B can rest on the base (e.g., as wafer in the lower position 104A). The pin 108 can be retracted as a controlled motion so as not to unbalance the wafer 104B while resting on the pin. As discussed above, the pin 108 can retract into the base 106, or at least be flush with the base 106 so that the wafer 104A can rest on the base 106 once the pin 108 is retracted.

Once the wafer 104A is secured, wafer processing can be performed in the chamber 100 and within the annulus ring. As discussed above, any of a variety of processes can be performed on the wafer 104A in the semiconductor wafer processing chamber. Example processes that can be performed in these semiconductor wafer processing chambers include processes related to physical vapor deposition (PVD), chemical vapor deposition (CVD), wet etching, dry etching, wet cleaning, dry cleaning, and plasma etching. These processes can include focusing gas, plasma, etchant, or other processing medium onto the wafer in a focused and even manner in virtue of the fixed focus ring that surrounds the extremities of the wafer.

After processing, the wafer 104A can be moved by vertically extending the pin 108 after semiconductor wafer processing is completed. The pin 108 can be vertically extended so as to move the wafer into the upper position (e.g., as wafer 104B) above the fixed focus ring 102. The pin 108 can be extended in a controlled manner so as to not unbalance the wafer 104B on the pin.

Figure 2A:
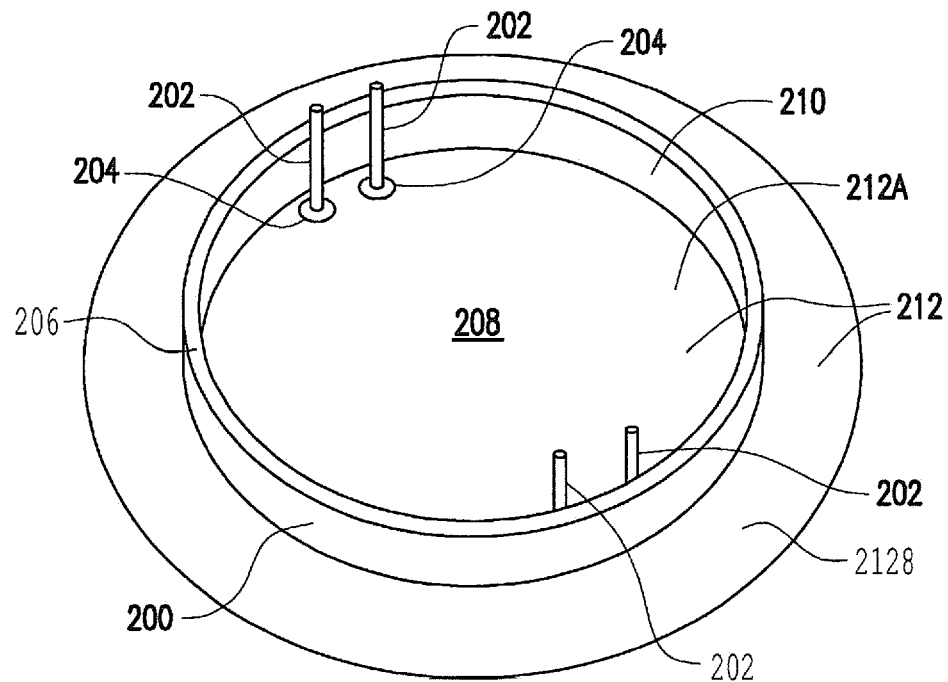
FIG. 2A is a perspective view of a fixed focus ring in a semiconductor wafer processing chamber with pins extended, in accordance with some embodiments.

When the pins 108 are fully extended, the robotic arm 130 can horizontally extend to retrieve the wafer 104B through the slit valve 134. For example, the robotic arm 130 can include a wafer blade that can be slipped underneath the wafer 104B held up by the pin 108 at the upper position. Then, after the pins 108 are retracted, the wafer 104B can be entirely supported (e.g., controlled) by the wafer blade. Then the robotic arm 130 can retract and bring the wafer 104B through the slit valve 134. In various embodiments, the robotic arm 130 can move the wafer to other chambers or to an automatic material handling system for further processing. FIG. 2A is a perspective view of a fixed focus ring 200 in a semiconductor wafer processing chamber with pins 202 extended, in accordance with some embodiments. As illustrated, the pins 202 may be in a bore hole 204 and extend above the top of the fixed focus ring. The pins 202 may receive a wafer at that extended position beyond (e.g., above) the top 206 of the fixed focus ring 200. The inner annulus region 208 may be a region bounded horizontally between the inner wall 210 of the fixed focus ring 200. Additionally, the fixed focus ring 200 may extend from a base 212. The base may also include an electrostatic chuck 212A as part of the base 212. In certain embodiments, the part of the base outside 212B of the inner annulus region 208 may be disposed higher than the part of the base within 212A the inner annulus region 208. In certain embodiments, the pins 202, fixed focus ring 200, and base 212 can comprise metal, ceramic, or other anticorrosive material.

Figure 2B:
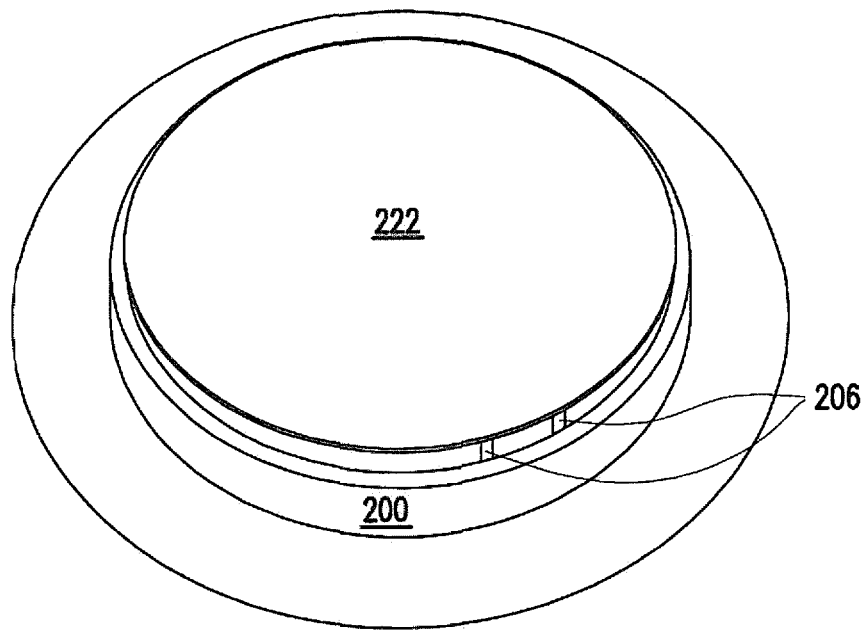
FIG. 2B is a perspective view of a fixed focus ring in a semiconductor wafer processing chamber with a wafer on the pins, in accordance with some embodiments.

FIG. 2B is a perspective view of a fixed focus ring 200 in a semiconductor wafer processing chamber receiving a wafer 222, in accordance with some embodiments. As illustrated, the wafer 222 may be within the inner annulus region and supported on the pins 202 above the top of the fixed focus ring 200. As discussed above, the wafer 222 may be brought into position to be received by the pins 206 via a robotic arm. In certain embodiments, the robotic arm may be configured to move the wafer horizontally, while the pins may be configured to move the wafer vertically.

Figure 2C:
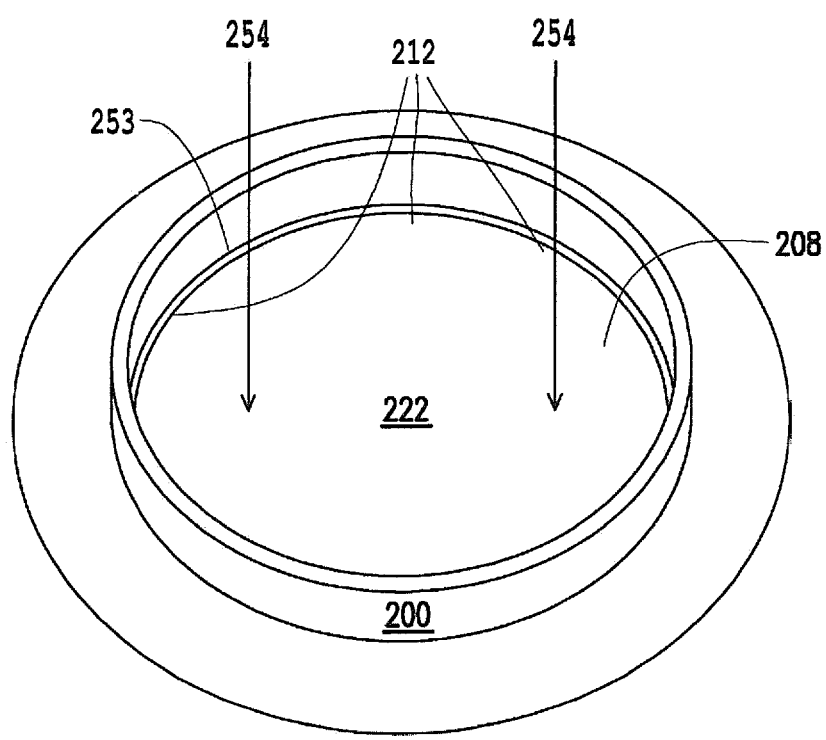
FIG. 2C is a perspective view of a wafer being processed within a fixed focus ring, in accordance with some embodiments.

FIG. 2C is a perspective view of a wafer 222 processed within a fixed focus ring 200, in accordance with some embodiments. The wafer 222 may be moved within the inner annulus region 208 to rest on the base 212. The wafer 222 may be moved vertically via the pins to rest on the base 212. Although the fixed focus ring 200 may surround the extremities of the wafer 222, there may be a space 253 between the extremities of the wafer and the fixed focus ring to allow for easy movement of the wafer through the inner annulus region. During semiconductor wafer processing, a gas, plasma, etchant, or other processing medium 254 may be focused onto the wafer 222 within the inner annulus region 208.

Figure 3:
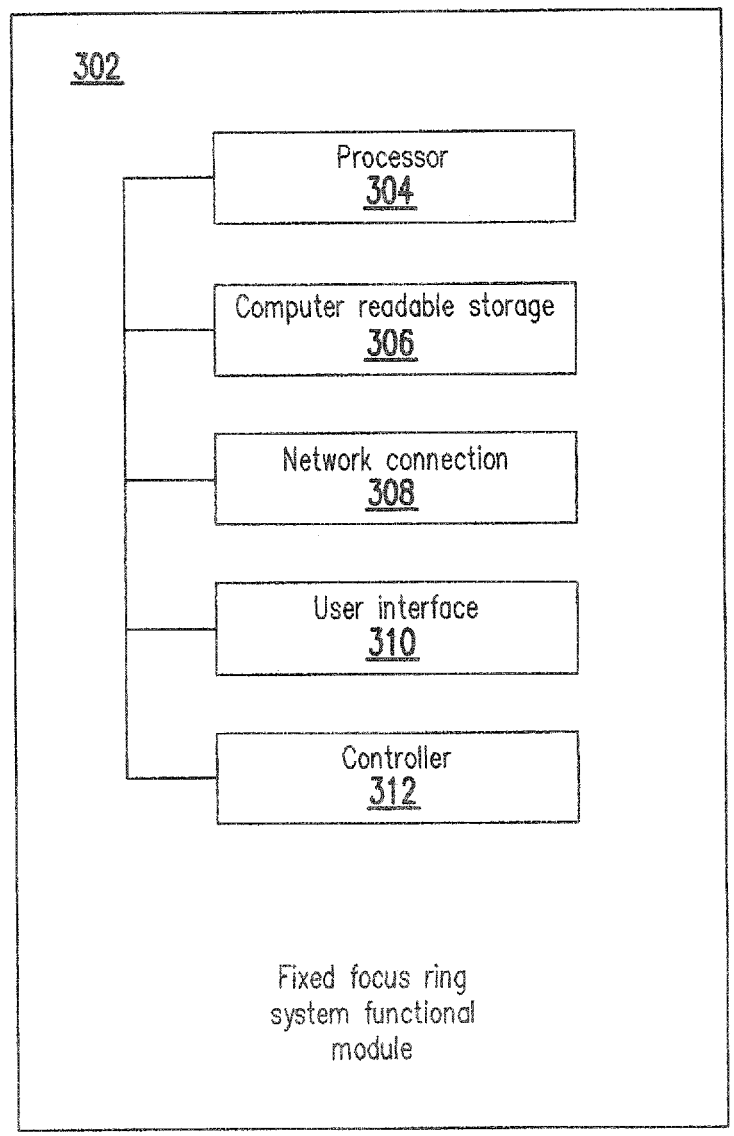
FIG. 3 is a block diagram of various functional modules of a fixed focus ring system, in accordance with some embodiment.

FIG. 3 is a block diagram of a fixed focus ring system functional module 302 of a fixed focus ring system, in accordance with some embodiment. The fixed focus ring system functional module 302 may be part of a fixed focus ring system discussed above. The fixed focus ring system functional module 302 may include a processor 304. In further embodiments, the processor 304 may be implemented as one or more processors.

The processor 304 may be operatively connected to a computer readable storage module 306 (e.g., a memory and/or data store), a network connection module 308, a user interface module 310, a controller module 312. In some embodiments, the computer readable storage module 306 may include fixed focus ring system logic that may configure the processor 304 to perform the various processes discussed herein. For example, the fixed focus ring system logic may configure the fixed focus ring system, using the processor, to coordinate actions between the pins and the robotic arm for wafer transport, as discussed above. The computer readable storage may also store data, identifiers for a wafer, identifiers for a robotic arm, and any other parameter or information that may be utilized to perform the various processes discussed herein.

The network connection module 308 may facilitate a network connection of the fixed focus ring system with various devices and/or components of the fixed focus ring system that may communicate within or external to the fixed focus ring system functional module 302. In certain embodiments, the network connection module 308 may facilitate a physical connection, such as a line or a bus. In other embodiments, the network connection module 308 may facilitate a wireless connection, such as over a wireless local area network (WLAN) by using a transmitter, receiver, and/or transceiver.

The fixed focus ring system functional module 302 may also include the user interface module 310. The user interface may include any type of interface for input and/or output to an operator of the fixed focus ring system, including, but not limited to, a monitor, a laptop computer, a tablet, or a mobile device, etc.

The fixed focus ring system functional module 302 may include a controller module 312. The controller module 312 may be configured to control various physical apparatuses that control movement or functionality of the robotic arm and/or the pins. For example, the controller module 312 may be configured to control movement or functionality for at least one of a robotic arm and/or a pin. For example, the controller module 312 may control a motor that may move at least one of a robotic arm and/or a pin. The controller may be controlled by the processor and may carry out the various aspects of the various processes discussed herein.

Figure 4:
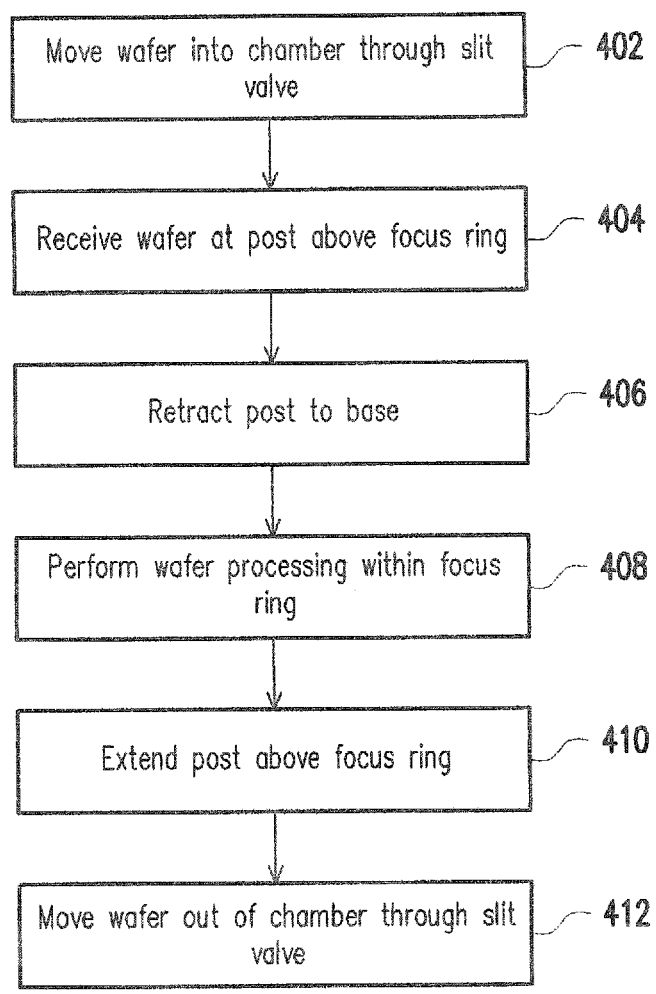
FIG. 4 is a flow chart of a fixed focus ring process, in accordance with some embodiments.

FIG. 4 is a flow chart of a fixed focus ring process, in accordance with some embodiments. The fixed focus ring process may be performed by a fixed focus ring system, as discussed above. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, a wafer may be moved horizontally through a slit valve above a fixed focus ring. Accordingly, the wafer may be moved to an upper position above the fixed focus ring within the inner annulus region of the fixed focus ring. The wafer may be moved by a robotic arm that is configured to move the wafer horizontally. In certain embodiments, the robotic arm may interface with multiple semiconductor wafer processing chambers and move wafers between the chambers and/or to and from the multiple semiconductor wafer processing chambers. In certain embodiments, the robotic aim may include a wafer blade or a clamp configured to secure the wafer to the robotic arm during transport by the robotic arm.

At operation 404, a wafer may be received at a pin above the fixed focus ring. The pin may extend from a base to the location of the wafer held by the robotic arm above the fixed focus ring. The robotic arm may release the wafer and retract back through the slit valve. During and/or after the retraction of the robotic arm, control of the wafer may pass from the robotic arm to the pin. The pin may support the wafer by having the wafer rest on the pin after release by the robotic arm. In various embodiments, multiple pins may be utilized to provide even support for the wafer on the pin.

At operation 406, the pin may be retracted through the annulus ring region so that the wafer may rest on the base. The pin may be retracted as a controlled motion so as not to unbalance the wafer while resting on the pin. The pin may retract into the base, or at least be flush with the base so that the wafer may rest on the base once the pin is retracted.

At operation 408, semiconductor wafer processing may be performed in the chamber and within the annulus ring. As discussed above, any of a variety of processes may be performed on the wafer in the semiconductor wafer processing chamber. Example processes that may be performed in these semiconductor wafer processing chambers include processes related to physical vapor deposition (PVD), chemical vapor deposition (CVD), wet etching, dry etching, wet cleaning, dry cleaning, and plasma etching. These processes may include focusing gas, plasma, etchant, or other processing medium onto the wafer in a focused and even manner in virtue of the fixed focus ring that surrounds the extremities of the wafer. As discussed above, the fixed focus ring can focus the gas, plasma, etchant, or other processing medium to a wafer disposed within the fixed focus ring. By being immobile, the fixed focus ring will be less susceptible to damage (e.g., exposure) from the gas, plasma, etchant, or other processing medium than if the fixed focus ring was mobile. For example, the gas, plasma, etchant, or other processing medium may not get in-between moving parts as there are no moving parts of an immobile, fixed focus ring.

At operation 410, the wafer may be moved by vertically extending the pin after semiconductor wafer processing is completed. The pin may be vertically extended so as to move the wafer into the upper position above the fixed focus ring. The pin may be extended in a controlled manner so as to not unbalance the wafer on the pin.

At operation 412, the robotic arm may horizontally extend to retrieve the wafer through the slit valve. For example, the robotic arm may include a wafer blade that may be slipped underneath the wafer held up by the pin at the upper position. Then, after the pins are retracted, the wafer may be entirely supported (e.g., controlled) by the wafer blade. Then the robotic arm may retract and bring the wafer through the slit valve. In various embodiments, the robotic arm may move the wafer to other chambers or to an automatic material handling system for further processing.

In an embodiment, a system includes: a base with a bore hole, wherein the base is configured to secure a wafer at a first position on the base; a pin extending through the bore hole; a focus ring horizontally surrounding the wafer at the first position and extending upwardly from the base, wherein the wafer is configured to be moved vertically between the first position and a second position above the focus ring via the pin; and a slit valve above the focus ring, wherein the wafer is configured to be moved horizontally between the second position and the slit valve via a robotic arm.

In another embodiment, a chamber, includes: a base with a bore hole, wherein the base is configured to secure a wafer at a first position on the base; a pin configured to extend through the bore hole and retract into the bore hole; and a focus ring horizontally surrounding the wafer at the first position and extending upwardly from the base, wherein the focus ring is immovably secured to the base, and wherein the wafer is configured to be moved vertically between the first position and a second position above the focus ring via the pin In another embodiment, a method includes: retrieving a wafer at a position above a focus ring, wherein the focus ring extends from a base; moving the wafer vertically through an inner annulus region, bounded by the focus ring, to rest on the base; processing the wafer resting on the base within the focus ring; and moving the wafer vertically through the inner annulus region of the focus ring to the position above the focus ring.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
    a base with a bore hole, wherein the base is configured to secure a wafer at a first position on the base;
    a pin extending through the bore hole;
    a focus ring horizontally surrounding the wafer at the first position and extending upwardly from the base, wherein the pin is configured to be move the wafer vertically between the first position and a second position above the focus ring, wherein the focus ring comprises an annular internal vertical wall defining an inner annulus region and a horizontal annular top surface such that a total height of the focus ring is defined by a distance from a top surface of the base to the horizontal annular top surface, and wherein the second position is located above the horizontal annular top surface by 25% to 100% of the total height of the focus ring; and
    a slit valve located above the horizontal annular top surface of the focus ring, wherein the slit valve is configured to allow the wafer to be moved horizontally between the second position and the slit valve via a robotic arm.

2. The system of claim 1, wherein the focus ring is immovably secured to the base with a focus ring diameter wider than a diameter of the wafer.

3. The system of claim 1, wherein the robotic arm comprises a wafer blade configured to receive the wafer at the second position, wherein the second position clears the focus ring at a clearance height less than a height of the focus ring.

4. The system of claim 1, wherein the slit valve is configured to be in an open state during transport of the wafer by the robotic art to or from the second position and configured to be in a closed state when the wafer is in the first position.

5. The system of claim 1, wherein the slit valve is disposed along a wall of a semiconductor wafer processing chamber above the focus ring.

6. The system of claim 1, wherein the base comprises an electrostatic chuck configured to secure the wafer during semiconductor wafer processing.

7. The system of claim 1, wherein the pin is configured to retract into the bore hole.

8. The system of claim 1, wherein the wafer is configured to be processed by at least one of etching and chemical vapor deposition while at the first position.

9. The system of claim 1, wherein the semiconductor wafer processing chamber is configured to perform at least one of a physical vapor deposition process and a chemical vapor deposition process when the wafer is located at the first position.

10. A chamber, comprising:
    a base with a bore hole, wherein the base is configured to secure a wafer at a first position on the base;
    a pin configured to extend through the bore hole and retract into the bore hole; and a focus ring horizontally surrounding the wafer at the first position and extending upwardly from the base, wherein the focus ring is immovably secured to the base, and wherein the pin is configured to move the wafer vertically between the first position and a second position above the focus ring, wherein the focus ring comprises an annular internal vertical wall defining an inner annulus region and a horizontal annular top surface such that a total height of the focus ring is defined by a distance from a top surface of the base to the horizontal annular top surface, and wherein the second position is located above the top horizontal annular surface by 25% to 100% of the total height of the focus ring.

11. The chamber of claim 10, wherein the wafer is configured to be moved horizontally between the second position and a slit valve above the focus ring by a robotic arm.

12. The chamber of claim 11, wherein the robotic arm comprises a wafer blade configured to receive the wafer at the second position.

13. The chamber of claim 11, wherein the slit valve is configured to be in an open state during transport of the wafer by the robotic art to or from the second position and configured to be in a closed state when the wafer is in the first position.

14. The chamber of claim 11, wherein the slit valve is disposed along a wall of the chamber above the focus ring.

15. The chamber of claim 10, wherein the chamber comprises a vacuum pump that draws gas out of the chamber.

16. The chamber of claim 10, wherein the chamber is configured for least one of plasma etching and chemical vapor deposition processes.

17. A system, comprising:
a semiconductor wafer processing chamber;
a base contained within the semiconductor wafer processing chamber, the base being configured to secure a wafer at a first position and comprising a plurality of bore holes;
a plurality of pins extending through the plurality of bore holes, respectively;
a focus ring horizontally surrounding the wafer at the first position and extending upwardly from the base, wherein the plurality of pins are configured to move the wafer vertically between the first position and a second position above the focus ring, wherein the focus ring comprises an annular internal vertical wall defining an inner annulus region and a horizontal annular top surface such that a total height of the focus ring is defined by a distance from a top surface of the base to the horizontal annular top surface, and wherein the second position is located above the horizontal annular top surface by 25% to 100% of the total height of the focus ring;
a slit valve formed on a side wall of the semiconductor wafer processing chamber at vertical position located above the annular top surface of the focus ring;
a robotic arm configured to move the wafer horizontally between the second position and the slit valve via a robotic arm; and
at least one processor, coupled to the plurality of pins and the robotic arm, the at least one processor being configured to control movement of the plurality of pins and the robotic arm.

18. The system of claim 17, wherein the focus ring is immovably secured to the base with a focus ring diameter wider than a diameter of the wafer.

19. The system of claim 17, wherein the robotic arm comprises a wafer blade configured to receive the wafer at the second position, wherein the second position clears the annular top surface of focus ring at a clearance height less than the total height of the focus ring.

20. The system of claim 17, wherein the slit valve is configured to be in an open state during transport of the wafer by the robotic art to or from the second position and configured to be in a closed state when the wafer is in the first position.

* * * * *